United States Patent [19]

Leighton

[11] 4,339,407

[45] Jul. 13, 1982

[54] ELECTRONIC CIRCUIT ENCAPSULATION

[75] Inventor: Robert D. Leighton, Brockton, Mass.

[73] Assignee: Alden Research Foundation, Brockton, Mass.

[21] Appl. No.: 192,950

[22] Filed: Oct. 2, 1980

[51] Int. Cl.³ .............................................. B29C 6/02
[52] U.S. Cl. ..................... 264/229; 249/91; 249/95; 264/261; 264/263; 264/272.14; 264/272.15; 425/111; 425/117; 425/123
[58] Field of Search .............. 264/272, 263, 275, 229, 264/261; 249/91, 95; 174/52 PE; 361/395, 398, 417, 419, 420, 424; 425/111, 117, 123

[56] References Cited

U.S. PATENT DOCUMENTS

| | | | |
|---|---|---|---|
| 2,286,090 | 6/1942 | Harrison | 264/272.12 |
| 2,590,821 | 3/1952 | Kiser | 264/272.14 |
| 2,713,700 | 7/1955 | Fisher | |
| 2,747,230 | 5/1956 | Magnus | |
| 2,856,639 | 10/1958 | Forrest et al. | |
| 2,877,544 | 3/1959 | Gammel | 264/272.14 |
| 2,914,600 | 11/1959 | Smith et al. | 264/272.19 |
| 2,953,757 | 9/1960 | Yarrick et al. | 264/272.19 |
| 3,044,127 | 7/1962 | Alden | |
| 3,084,391 | 4/1963 | Parstorfer | 174/52 PE |
| 3,098,950 | 7/1963 | Geshner | 174/52 PE |
| 3,210,701 | 10/1965 | Fastner et al. | 174/52 PE |
| 3,236,937 | 2/1966 | Harkness et al. | 264/272.19 |
| 3,238,286 | 3/1966 | Davis | 264/272.19 |
| 3,403,366 | 9/1968 | Klatte et al. | 174/52 PE |
| 3,436,610 | 4/1969 | Sparrow et al. | 264/272.18 |
| 3,668,779 | 6/1972 | Turner | 264/263 |
| 3,712,575 | 1/1973 | Benent et al. | 249/91 |
| 3,715,423 | 2/1973 | Dunn | 264/263 |
| 3,806,766 | 4/1974 | Fanning | 264/272.18 |
| 3,838,316 | 9/1974 | Brown et al. | 174/52 PE |
| 3,869,563 | 3/1975 | Ockin, Jr. | 174/52 PE |
| 3,952,142 | 4/1976 | Weiss | 174/52 PE |
| 4,109,224 | 8/1978 | Liasitand | 264/272.19 |
| 4,143,932 | 3/1979 | Boutros | 361/398 |

FOREIGN PATENT DOCUMENTS

| | | | |
|---|---|---|---|
| 1228692 | 11/1966 | Fed. Rep. of Germany | 361/417 |
| 1466292 | 12/1968 | Fed. Rep. of Germany | 264/272.11 |
| 2821900 | 11/1978 | Fed. Rep. of Germany | 264/229 |
| 1069482 | 5/1967 | United Kingdom | 249/91 |

Primary Examiner—James B. Lowe
Attorney, Agent, or Firm—James H. Grover

[57] ABSTRACT

Encapsulation of electrical circuitry by high pressure injection molding of an insulative thermoplastic material about electrical components supported in a preformed carrier which is itself supported in an outer mold. The carrier has an internal configuration of lands and grooves which facilitates circuit insertion, the walls of which carrier are yieldable to flex inwardly to permit registration of the carrier walls with the outer mold and to securely hold the circuit during the injection process during which both the mold and the carrier are filled. The carrier is vented to insure complete encapsulation throughout the circuitry therein.

7 Claims, 10 Drawing Figures

ELECTRONIC CIRCUIT ENCAPSULATION

BACKGROUND OF THE INVENTION (1) Field of the Invention

This invention relates to injection molding techniques and apparatus and more particularly to mold arrangements utilized with the encapsulation of electrical components.

(2) Prior Art

It is common to mold insulation on one or more circuit elements having leads or terminals connected thereto by potting or pouring fluid insulation around the elements held in a pot like receptacle which may form a part of the finished product. The operation is slow and it does not generate a strong bond between the elements and the insulation. Injection molding with a thermoplastic material is superior because of improved sealing action, curing time and fast injection capabilities. High pressures utilized to force the thermoplastic material into a mold and around the components disarrange the electrical components with respect to one another and with respect to the mold walls. This affects the heat transfer characteristics of electrical components, and hence diminishes their efficiency and life expectancy.

Early attempts at encasing electrical components are shown in U.S. Pat. No. 2,713,700 to Fisher and 2,856,639 to Forrest et al. The patent to Fisher suggests enclosing the component body within a protective plastic medium whose molding requires no injuriously high pressures, and supported between opposed mold sections. The patent to Forrest et al shows a method of encasing electrical coils by means which includes mounting them on a mandrel within a mold and pouring the encapsulant into the mold. A further attempt at encasing articles is shown in U.S. Pat. No. 2,747,230 to Magrues wherein the article is placed between halves of a preliminary plastic form which is then enclosed in a mold and lugs in the form hold the article in the desired position. The form encloses the article and protects it from the encapsulant material, the form coalescing with the encapsulant, the article however not being closely supported by the encapsulant.

Advances in the insulating and encapsulating of components are shown in U.S. Pat. No. 3,044,127 to Alden, which discloses a method of fitting a separate support in a mold, placing an electrical element on the support to securely position the element in the mold, closing the mold, injecting insulation into the mold at least partially to encase the element, and subsequently separating the enclosed element and support from the mold. The support may be molded on a part of the element prior to secondary encasement, or the primary covering may be formed separately and applied to the element prior to putting it in the mold for secondary encasement. However, the invention disclosed in the U.S. Pat. No. 3,044,127 patent to John Alden is not applicable to an entire circuit and to the problems of alignment between the elements, internal flow problems of the thermoplastic material therearound, circuit inter-fitting and circuit support within the carrier.

It is thus an object of the present invention to provide a method of encapsulating an electrical circuit comprising a plurality of discrete however-interconnected electrical components.

It is another object of the present invention to provide a carrier for an electrical circuit that may be encapsulated with the electrical circuit.

It is yet another object of the present invention to provide a carrier for an electronic circuit which permits simple error free loading thereof, while maintaining alignment of the electrical components therein during encapsulation.

It is a further object of the present invention to provide a method for encapsulating an electronic circuit wherein the circuit can be loaded in a carrier in a simple manner prior to encapsulation, said carrier deforming to secure and maintain the electronic components therein in aligned positions.

BRIEF SUMMARY OF THE INVENTION

The present invention relates to encapsulation of multi-component electronic circuit arrangements. The preconnected circuit is placed in a carrier, which has an open end for receiving the circuit, and a closed end having small orifices therethrough for intermating with any leads of the electrical components. The carrier has walls which have a proper arrangement of lands, grooves and bosses in combination with specific orifices as well as curved and flat wall sections to hold the circuit assembly in alignment therebetween. The walls of the carrier are also slightly flexible and yield to facilitate insertion of the circuitry components. The carrier itself being insertable into an outer mold which causes the carrier walls to move toward one another to hold the components securely in alignment during the injection of the thermoplastic material. The outside of the walls of the carrier has projections thereon which serve to mate with detents on the walls of the mold to locate the carrier within the mold and to properly deflect the walls thereof accordingly. The leads of any of the components which extend through the orifices of the carrier may extend through orifices in the mold. The mold has holes to permit the escape of trapped gases and facilitate the injection of the thermoplastic material therein.

BRIEF DESCRIPTION OF THE DRAWINGS

The objects and advantages of the present invention will become more apparent when viewed in conjunction with the following drawings in which.

DESCRIPTION OF THE PREFERRED EMBODIMENTS

Figure 1:
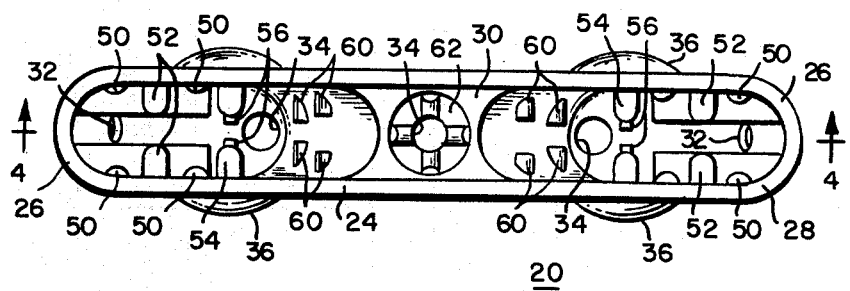
FIG. 1 is an end view of a carrier for supporting a particular electronic circuit, said carrier constructed according to the principles of the present invention.
Figure 2:
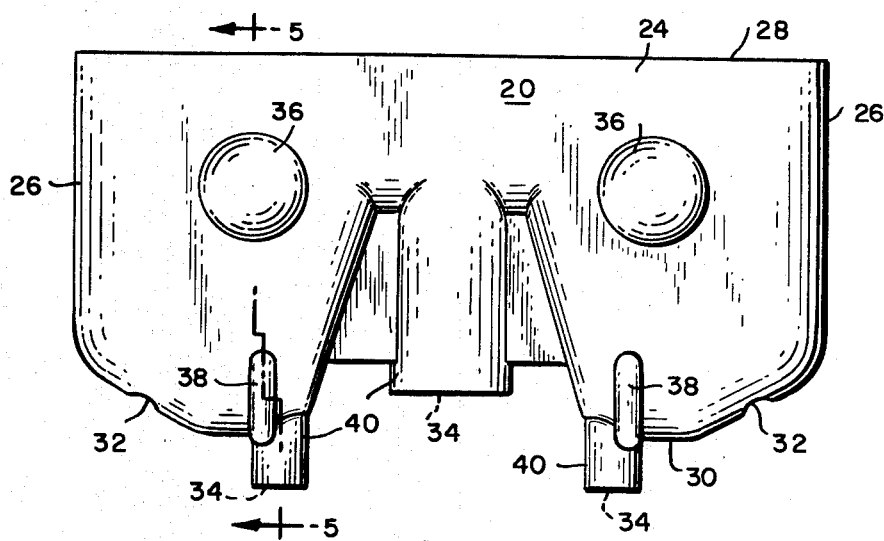
FIG. 2 is a side view of the carrier shown in FIG. 1.
Figure 3:
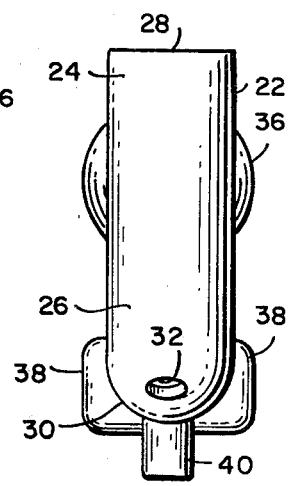
FIG. 3 is an end view of the carrier shown in FIG. 1.

Referring to the drawings in detail and particularly to FIG. 1 there is shown a pre-formed carrier 20 of hollow sheath-like configuration, said carrier 20 being utilizable in the encapsulation of electronic circuitry or the like. The carrier 20 may be comprised of an arrangement of walls, which in this embodiment includes a first side wall 22 and a second side wall 24, joined at their sides to define edge walls 26 of the carrier 20. The carrier 20 has an open end 28 and a generally closed end 30, which closed end 30 however has a plurality of orifices 32 and 34, to permit various functions therewith, to be described below. The exterior of each side wall 22 and 24 has a plurality of outside projections 36 disposed thereon. The outside projections 36, shown in FIGS. 1, 2 and 3, are hemispherically shaped in this embodiment, although they could be of polyhedral configuration, or they may extend inwardly from the external sides of the walls 22 and 24 to form detents. The side walls 22 and 24 may also have a plurality of protrusions 38 thereon. These protrusions 38, as shown in FIGS. 2 and 3, are of oblong shape and are located near the closed end 30 of the carrier 20 and provide strength thereto. In this embodiment, the carrier 20 also has cylindrical members 40 through which some orifices 34 may extend.

Figure 4:
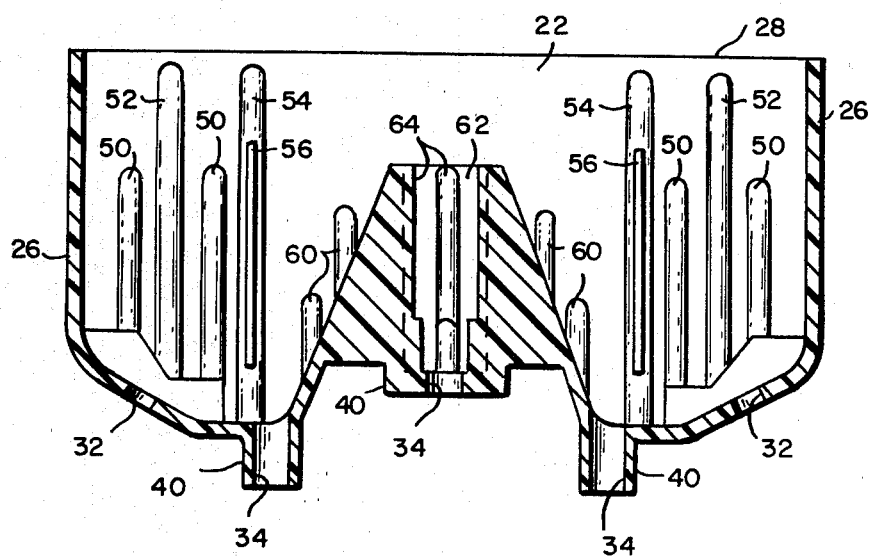
FIG. 4 is a sectional view taken along the lines IV—IV of FIG. 1.
Figure 5:
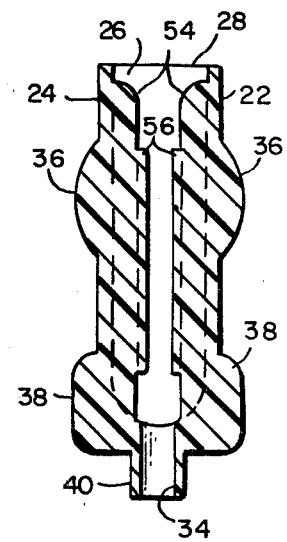
FIG. 5 is a sectional view taken along the lines V—V of FIG. 2.

The inside of the walls 22, 24 and 26 have an arrangement of lands, grooves and bosses thereon, which are aligned generally parallel with respect to one another between the open and closed ends 28 and 30 of the carrier 20, as shown in FIGS. 1, 4 and 5. More particularly, there is shown in end view in FIG. 1, a first arrangement of shallow bosses 50 extending a short distance from the inside of the walls 22 and 24 and which may also be opposite and spaced from one another by a predetermined distance within the carrier 20. There is also shown in FIG. 1 in an end view, an arrangement of deep bosses 52, extending from the inside of the walls 22 and 24 by a larger distance than the first arrangement of bosses 50. The second arrangement of bosses 52 are also opposite one another a predetermined distance within the carrier 20. A further arrangement of deep bosses 54 may be disposed from the inside of the walls 22 and 24, having a ridge 56 extending thereon.

Figure 6:
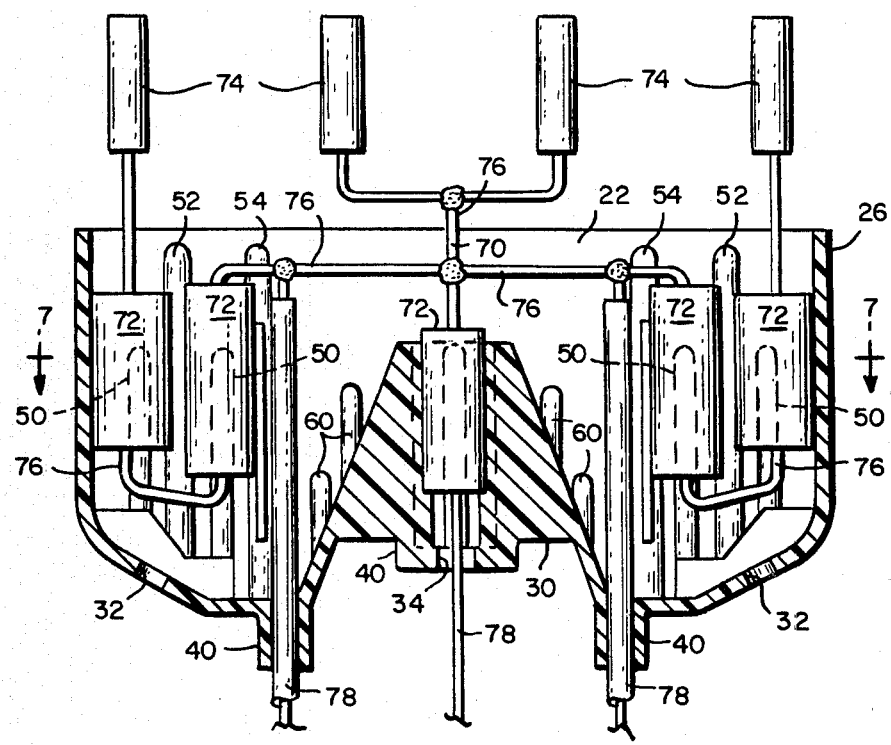
FIG. 6 is a sectional view of a carrier having an electronic circuit arranged therein.

A plurality of lands 60 may be arranged centrally within this embodiment, as shown in FIGS. 1, 4 and 6. A cylindrical cavity 62, is shown in FIGS. 1 and 4 having a plurality of longitudinally spaced projections 64 extending therewithin. The cavity 62 in this embodiment has one of the orifices 34 at one end thereof.

Figure 10:
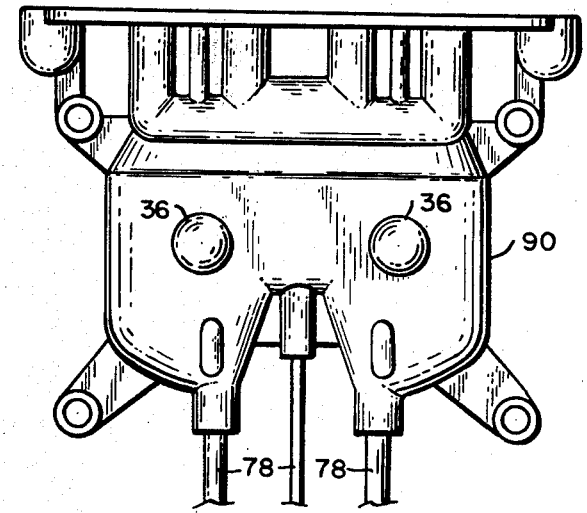
FIG. 10 is a side view of an encapsulated circuit and carrier removed from the mold.

As aforesaid, the carrier 20 is utilizable for the insulative encapsulation of electronic components arranged in a circuit. Such a circuit 70 is shown in FIG. 6 having a particular configuration to mate with a pre-formed carrier 20 adapted to receive it. The circuit 70 shown has a plurality of cylindrical components 72 which have been inserted within the carrier 20. There may be other components such as jacks 74 or the like extending therefrom. The components 72 may be of some other shape within the carrier 20, or have components other than jacks on the outside thereof, and still be within the scope of this invention, all of these components being interconnected by an arrangement of leads 76. The circuit 70 may also include a layout of insulated leads or component leads or wires 78, which in FIGS. 7 and 10 are shown extending through the orifices 34 to the outside of the carrier 20.

The method of utilization of this pre-formed carrier in the encapsulation art comprises the insertion of a particular circuit 70 therewithin, with whatever component leads or insulated wires 78 extending through the orifices 34, as necessary in the closed end 30 of the carrier 20. The components 72, which are cylindrically shaped in this embodiment, are fit between the shallow bosses 50 generally across one diameter thereof, and nested between the edge walls 26 and the deep bosses 52 or nested between the deep bosses 52, the deep bosses 54 with the ridge 56 and between a pair of shallow bosses 50, as shown in FIG. 7. Only one component 72 in this embodiment is nested within its own cavity 62 with spaced projections 64 arranged therearound to securely hold the component 72 therein.

Figure 7:
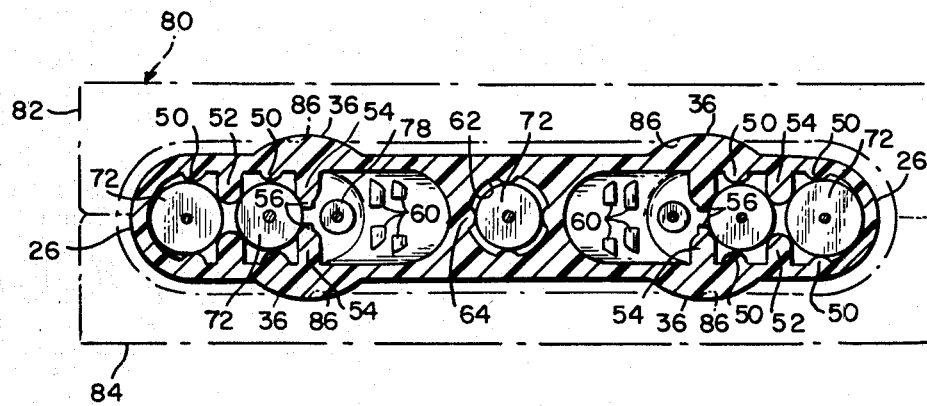
FIG. 7 is a view taken along the lines VII—VII of FIG. 6.
Figure 8:
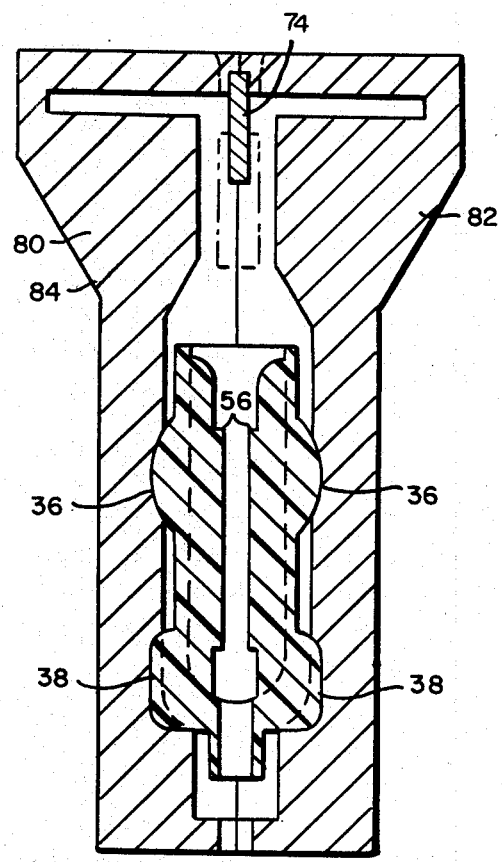
FIG. 8 is a sectional view of a carrier in a support mold.
Figure 9:
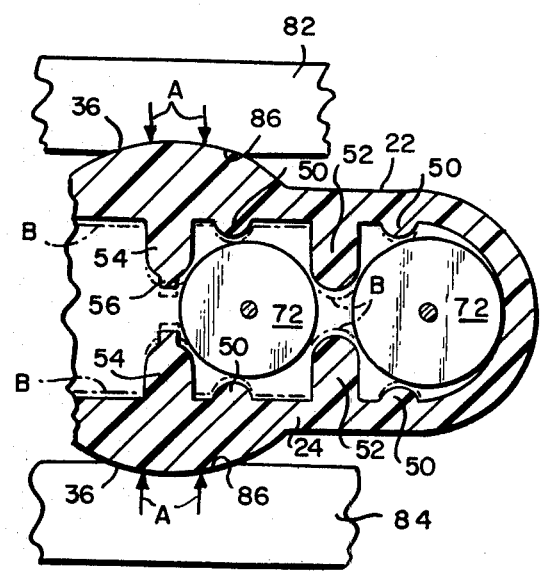
FIG. 9 is a partial sectional view of components within the carrier which itself is arranged within the support mold.

The pre-formed carrier 20 with its electronic circuit 70 fitted therewith, is itself inserted into an outer mold 80, as shown in FIGS. 7, 8 and 9. The outer mold 80, may comprise two or more mold portions 82 and 84 that fit together to envelope the pre-formed carrier 20 and its associated circuitry 70, which are separable after completion of the process, to remove the final product, shown in FIG. 10. The inner walls of the mold portion 82 and 84 each may have a plurality of detents 86 which serve to properly locate the carrier 20 therewithin by registration of the outside projections 36 therein as they are inserted thereadjacent, because the walls 22 and 24 of the carrier 20 are resilient, and as such, flex inwardly as the carrier 20 is being inserted into the outer mold 80. Once the outside projections 36 have properly seated themselves in the detents 86 in the walls of the mold 80, the walls 22 and 24 of the carrier adjust themselves to their environment as well as hold their respective components 72 and securely support them against misalignment during subsequent injection of hot thermoplastic encapsulant under high pressure. The engagement between the outer mold portions 82 and 84, and the forces they develop within the walls 22 and 24 of the carrier 20 are shown in FIG. 9, indicated by arrows marked "A" which results in the innermost flexure of the walls 22 and 24, also indicated therewith, by dashed lines "B" occuring during the insertion of the carrier 20 into the mold 80.

As the encapsulant is forced into the cavity of the outer mold 80, it is caused to enter the carrier 20 as well as fill outside around it, coalescing therewith since they are both formed of compatable or identical substances. The jacks 74 or components outside of the carrier may be plugged or sealed against encapsulant infiltration and supported through the top of the mold 80 by holding means associated therewith, and are also thus enveloped by the encapsulant as is the carrier 20 and its components 72 therein.

The aforementioned orifices 32, in the closed end 30 of carrier 20 provide venting therewith, which is essential to complete filling of the carrier 20 and any voids in the other orifices 34. The lands and bosses 50, 52 and 54 on the carrier walls 22 and 24 also help direct the flow of encapsulant within the carrier 20, and some of the lands 60 are included to provide strength to the walls 22 and 24 of the carrier 20. After the encapsulant in and around the carrier 20 in the mold 80 has cured, the mold portions may be removed to expose an encapsulated circuit 90, as shown in FIG. 10.

Thus, there has been shown a method and an apparatus for molding an entire electronic network which includes both active and passive components, wherein a carrier, which is specifically adapted for each particular network configuration, uses a plurality of lands, grooves and bosses in combination with cylindrical cavities, curved and flat flexible wall portions to hold the entire network securely in place during the high pressure encapsulation process. The walls of the carrier being flexible to permit the pre-assembled network of electrical components to be inserted into the mold, and to permit clearance between the carrier and the mold prior to registration between the projections and detents adapted respectively therewith, the lands and bosses directing the flow of encapsulant therearound as well as securely holding the components between the carrier walls after flexure thereof.

It is intended however, that the appended claims describing the apparatus and method of the present invention be interpreted as exemplary only, and not in a limiting sense.

I claim:

1. A support for holding an electrical component during encapsulation in a mold, the support comprising:
   a mold;
   a carrier having opposed walls at least one of which is flexible toward the other; and
   means on the opposed walls for engaging opposite sides of a component therebetween and locating the component relative to the opposed walls, the engaging means on respective opposed walls cooperatively gripping the component with force applied by wall flexure, and means for interengagement between the carrier and mold for deflecting the carrier wall to apply said gripping force on the component.

2. A carrier according to claim 1 wherein the carrier includes said interengagement means.

3. A carrier according to claim 2 wherein the interengagement means comprises a projection outside the carrier beyond the exterior of the flexible carrier wall.

4. A carrier according to claim 1 wherein the engaging means are on the inside of the walls.

5. A carrier according to claim 1 wherein the engaging means comprise two bosses raised from the inner face of at least one wall and disposed so as to oppose movement of a component gripped therebetween laterally of the wall.

6. The method of encapsulating an electrical component comprising:
   inserting the component in a carrier between opposed carrier walls;
   enclosing the carrier in a mold and engaging the exterior of the carrier with the mold thereby deflecting the walls of the carrier with force applied by the closing of the mold on the carrier thereby to deflect the inside of the walls of the carrier into gripping engagement of the component; and
   injecting encapsulant into the mold while the component is so gripped against movement by flow of the encapsulant.

7. Method of encapsulating an electrical component according to claim 6 including gripping the component laterally of the deflection of the walls.

* * * * *